(12) United States Patent
Lee et al.

(10) Patent No.: US 12,315,408 B2
(45) Date of Patent: *May 27, 2025

(54) PAD AREA OF DISPLAY DEVICE HAVING OPENING AND COMPONENT THEREIN AND METHOD OF PROVIDING THE SAME

(71) Applicant: Samsung Display Co., LTD., Yongin-si (KR)

(72) Inventors: Sang Duk Lee, Yongin-si (KR); Chan Jae Park, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/498,566

(22) Filed: Oct. 31, 2023

(65) Prior Publication Data

US 2024/0062692 A1 Feb. 22, 2024

Related U.S. Application Data

(63) Continuation of application No. 18/079,109, filed on Dec. 12, 2022, now Pat. No. 11,842,663.

(30) Foreign Application Priority Data

Dec. 20, 2021 (KR) ........................ 10-2021-0182684

(51) Int. Cl.
G09G 3/00 (2006.01)
G09G 5/00 (2006.01)
H05K 5/00 (2006.01)

(52) U.S. Cl.
CPC ............. *G09G 3/035* (2020.08); *G09G 5/006* (2013.01); *H05K 5/0065* (2013.01)

(58) Field of Classification Search
CPC ...... G06F 1/1652; G06F 1/1637; G09F 9/301; G09G 3/03; G09G 3/035; G09G 5/006;
(Continued)

(56) References Cited

U.S. PATENT DOCUMENTS

2005/0046622 A1 3/2005 Nakanishi ............... G06F 3/045
345/173
2016/0275830 A1* 9/2016 You ................... G02F 1/133305
(Continued)

FOREIGN PATENT DOCUMENTS

| KR | 1020150079223 A | 7/2015 |
|---|---|---|
| KR | 1020170032524 A | 3/2017 |
| KR | 1020190071026 A | 6/2019 |

*Primary Examiner* — Richard J Hong
(74) *Attorney, Agent, or Firm* — CANTOR COLBURN LLP

(57) ABSTRACT

The present application relates to a display device and a method of providing the same. A display device includes a display panel which is bendable, the display panel including a bending area and a pad area which is adjacent to the bending area, and a lower layer extending along the pad area of the display panel. The lower layer includes a lower film layer defining an opening at the pad area, the opening exposing a portion of the pad area to outside the lower film layer, and a step compensation member which is in the opening of the lower film layer and on the portion of the pad area which is exposed to outside the lower film layer.

20 Claims, 21 Drawing Sheets

(58) Field of Classification Search
CPC ............ H05K 5/0065; H05K 7/20963; H05K 1/0393; H10K 59/131; H10K 59/124; G02F 1/133305
See application file for complete search history.

(56) References Cited

U.S. PATENT DOCUMENTS

| | | | |
|---|---|---|---|
| 2018/0005948 A1* | 1/2018 | Jo ........................ | H05K 1/0393 |
| 2018/0069067 A1* | 3/2018 | Oh ....................... | H10K 59/131 |
| 2020/0137890 A1* | 4/2020 | Lee ....................... | G06F 1/1637 |
| 2020/0194712 A1 | 6/2020 | Choi ..................... | H10K 59/12 |
| 2020/0287301 A1 | 9/2020 | Van Swearingen | |
| 2021/0175462 A1 | 6/2021 | Shin ..................... | H10K 59/131 |
| 2023/0189579 A1* | 6/2023 | Choi ..................... | H10K 59/124 257/91 |
| 2023/0309280 A1* | 9/2023 | Park .................. | H05K 7/20963 |

* cited by examiner

DEL: 101, 102, 103, 104, 105, OLED, 170
120: GE
130: SE, DE, PE1

PAD AREA OF DISPLAY DEVICE HAVING OPENING AND COMPONENT THEREIN AND METHOD OF PROVIDING THE SAME

This application is a continuation application of U.S. application Ser. No. 18/079,109 filed Dec. 12, 2022, which claims priority to Korean Patent Application No. 10-2021-0182684 filed on Dec. 20, 2021, and all the benefits accruing therefrom under 35 U.S.C. 119, the contents of which in its entirety are herein incorporated by reference.

BACKGROUND

1. Field

The present disclosure relates to a display device.

2. Description of the Related Art

A display device having light weight and small size has been manufactured. A cathode ray tube (CRT) display device has been used due to performance and competitive price thereof. However, the CRT display device has a weakness with a size or portability thereof. Therefore, a display device, such as a plasma display device, a liquid crystal display device and an organic light-emitting display device, has been highly regarded due to small size, light weight and low-power-consumption.

The display device includes a display panel configured to display an image and a driving integrated circuit which is mounted on the display panel. The driving integrated circuit may be provided in the form of a driving chip.

SUMMARY

Aspects of the present disclosure provide a display device in which crack defect of a display panel during ultrasonic bonding is reduced.

Aspects of the present disclosure also provide a method of manufacturing (or providing) a display device in which crack defect of a display panel during ultrasonic bonding is reduced.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a display device including a display panel including a main area, a sub-area overlapping the main area, and a bending area between the main area and the sub-area, a first lower film on a first surface of the display panel in the main area that faces the sub-area, a second lower film on the first surface of the sub-area that faces the main area and exposing a pad area of the sub-area, and a step compensation member on the first surface of the pad area.

According to another aspect of the present disclosure, there is provided a method of manufacturing (or providing) a display device, the method including preparing a target display device configured to include a display panel including a main area, a sub-area overlapping the main area, and a bending area disposed (or provided) between the main area and the sub-area, a first lower film disposed on a first surface of the display panel in the main area that faces the sub-area, and a second lower film disposed on the first surface of the sub-area that faces the main area and exposing a pad area of the sub-area, and disposing a driving chip on a second surface of the pad area of the display panel, the second surface being opposite to the first surface of the pad area (or the sub-area). The disposing of the driving chip includes disposing a step compensation member on the first surface of the pad area, and directly connecting a bump of the driving chip onto a pad electrode provided on the second surface of the pad area.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
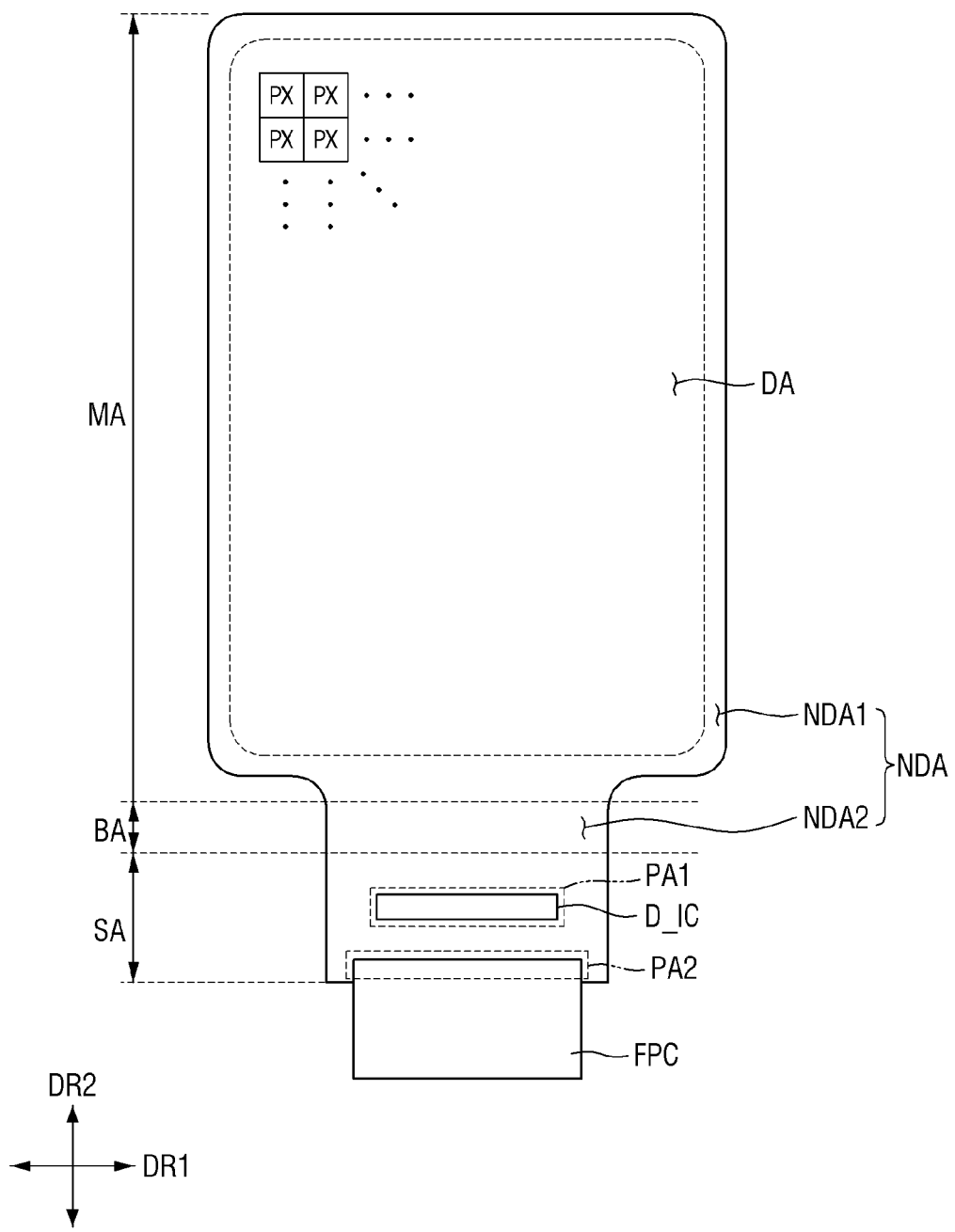
FIG. 1 is a plan view of a display device according to an embodiment.

Specific structural and functional descriptions of embodiments of the invention disclosed herein are only for illustrative purposes of the embodiments of the invention. The invention may be embodied in many different forms without departing from the spirit and significant characteristics of the invention. Therefore, the embodiments of the invention are disclosed only for illustrative purposes and should not be construed as limiting the invention. That is, the invention is only defined by the scope of the claims.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts. As used herein, a reference number may indicate a singular element or a plurality of the element. For example, a reference number labeling a singular form of an element within the drawing figures may be used to reference a plurality of the singular element within the text of specification.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "a first component", "a first region", "a first layer", or "a first section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described with reference to the attached drawings.

FIG. 1 is a plan view of a display device according to an embodiment.

Referring to FIG. 1, the display device may include a display area DA in which an image is displayed and a non-display area NDA which is adjacent to the display area DA. The display area DA may include a pixel PX provided in plural including a plurality of pixels PX. The non-display area NDA may include no pixels PX. The non-display area NDA may include a first peripheral area NDA1 surrounding the display area DA, and a second peripheral area NDA2 protruding downward from the first peripheral area NDA1 and in a direction away from the display area DA. The second peripheral area NDA2 may include a bending area BA, and one or more of a pad area. The pad area may include a first pad area PA1 in which a driving integrated circuit D_IC is disposed, and a second pad area PA2 in which a printed circuit film FPC is disposed. In an embodiment, a driving integrated circuit D_IC may be an external component which is connected to the display device at the first pad area PA1, and a printed circuit film FPC may be an external component which is connected to the display device at the second pad area PA2.

The first pad area PA1 may be disposed between the bending area BA and the second pad area PA2 in a plan view. That is, the bending area BA, the first pad area PA1 and the second pad area PA2 may be in order along a direction.

The display area DA may have a rectangular shape on a plane formed by a first direction DR1 and a second direction DR2 which crosses the first direction DR1, such as being perpendicular thereto. A thickness of the display device and various components or layers thereof may be defined along a third direction DR3 (e.g., a thickness direction). Corners of the display area DA may be round, but not limited thereto, and may be angular.

As shown in FIG. 1, the first peripheral area NDA1 includes a left first peripheral area adjacent to the left side of the display area DA, and a right first peripheral area adjacent to the right side of the display area DA, an upper first peripheral area adjacent to an upper side of the display area DA, and a lower first peripheral area adjacent to a lower side of the display area DA.

The width of the second peripheral area NDA2 in the first direction DR1 may be less than the width of the first peripheral area NDA1 in the first direction DR1. However, the present disclosure is not limited thereto, and the width of the second peripheral area NDA2 in the first direction DR1 may be equal to or greater than the width of the first peripheral area NDA1 in the first direction DR1. The second peripheral area NDA2 may be connected to the lower first peripheral area.

The bending area BA may be a portion at which the display device is foldable, bendable, etc.

The driving integrated circuit D_IC described above may be connected to the first pad area PA1. The driving integrated circuit D_IC may be provided in the form of a driving chip. A plurality of first pad electrodes PE1 (in FIG. 5) connected to the driving integrated circuit D_IC may be disposed in the first pad area PA1.

The printed circuit film FPC including a timing controller may be connected to the second pad area PA2. A plurality of second pad electrodes PE2 (in FIG. 5) connected to the printed circuit film FPC may be disposed in the second pad area PA2.

Although the display device according to an embodiment is divided into the display area DA and the non-display area NDA described above, the display device may be divided into a main area MA, a sub-area SA, and the above-described bending area BA according to the bent shape of the display device. Various components or layers of the display device may include a display area DA, a non-display area NDA, a main area MA, a sub-area SA and/or a bending area BA corresponding to those descried above. Various components or layers of the display device may be bendable, foldable, rollable, etc. together with each other.

The main area MA may include the display area DA, the first peripheral area NDA1 around the display area DA, and an area between the lower first peripheral area and the bending area BA in the second peripheral area NDA2 (at a first side of the bending area BA). The sub-area SA may include an area positioned on the other side of the bending area BA (e.g., a second side opposite to the first side of the bending area BA) of the second peripheral area NDA2 in the second direction DR2.

Figure 2A:
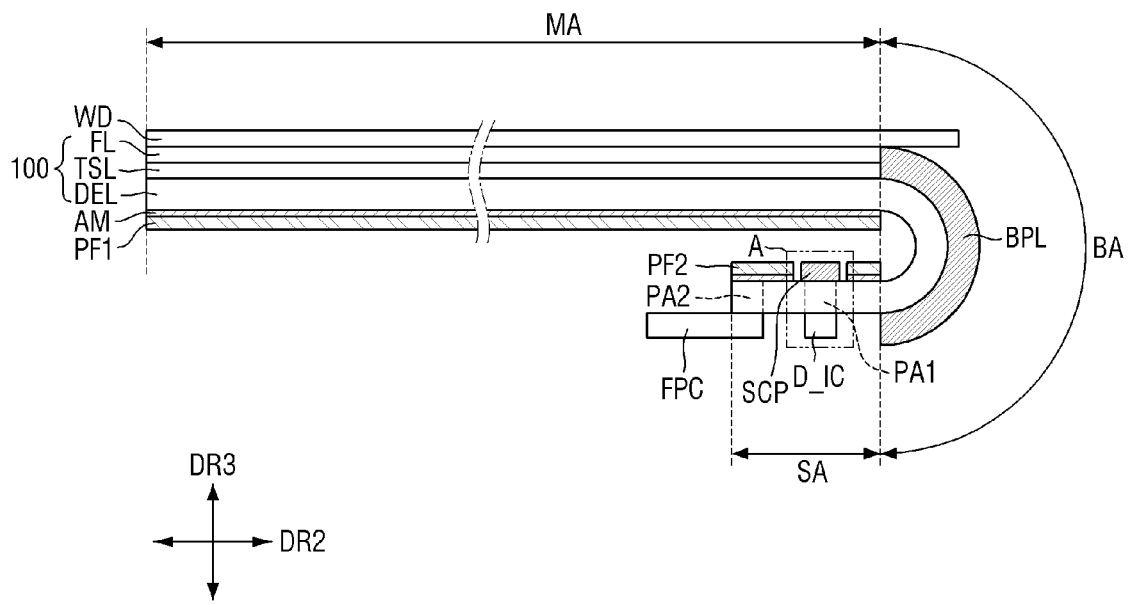
FIG. 2A is a cross-sectional view of a display device according to an embodiment when bent.

FIG. 2A is a cross-sectional view of a display device which is bent according to an embodiment.

Referring to FIGS. 1 and 2A, the main area MA of the display device according to an embodiment may overlap the sub-area SA in the thickness direction. That is, the display device which is bent disposes the main area MA overlapping the sub-area SA along the thickness direction. The display device according to an embodiment may include a display panel 100, and a cover window WD which is positioned above the display panel 100.

Examples of the display panel 100 include an organic light-emitting display panel, a micro light emitting diode (LED) display panel, a nano LED display panel, a quantum dot light-emitting display panel, a liquid crystal display panel, a plasma display panel, a field emission display panel, an electrophoretic display panel, an electrowetting display panel, and the like. In the following description, for convenience of explanation, an organic light-emitting display panel is employed as an example of the display panel. However, embodiments are not limited thereto, and other display panels are also applicable within the scope and technical spirit of the present disclosure.

The display panel 100 may include a display element layer DEL. The display panel 100 which is flat defines the display element layer DEL having a lower surface which is furthest from the cover window WD and an upper surface which is closest to the cover window WD. As shown in FIG. 2A, in the display panel 100 which is bent, a lower surface of the main area MA of the display element layer DEL (e.g., the lower surface of the display element layer DEL at the main area MA) according to an embodiment may face a lower surface of the sub-area SA of the display element layer DEL (e.g., the lower surface of the display element layer DEL at the sub-area SA). An upper surface of the main area MA of the display element layer DEL (e.g., the upper surface of the display element layer DEL at the main area MA) may face a first side in (or along) a third direction DR3 (e.g., a thickness direction), and an upper surface of the sub-area SA of the display element layer DEL (e.g., the upper surface of the display element layer DEL at the sub-area SA) may face the other side (e.g., a second side opposite to the first side) in the third direction DR3.

The display device according to an embodiment may further include lower films PF1 and PF2 under or below the display element layer DEL. The lower films PF1 and PF2 may together define a lower film layer which is disconnected at the bending area BA. A first lower film PF1 may be disposed under or below the main area MA of the display element layer DEL, and the second lower film PF2 may be disposed under or below the sub-area SA of the display element layer DEL (disposed between the sub-area SA and the first lower film PF1 in cross-sectional view in the display device which is bent).

Figure 7:
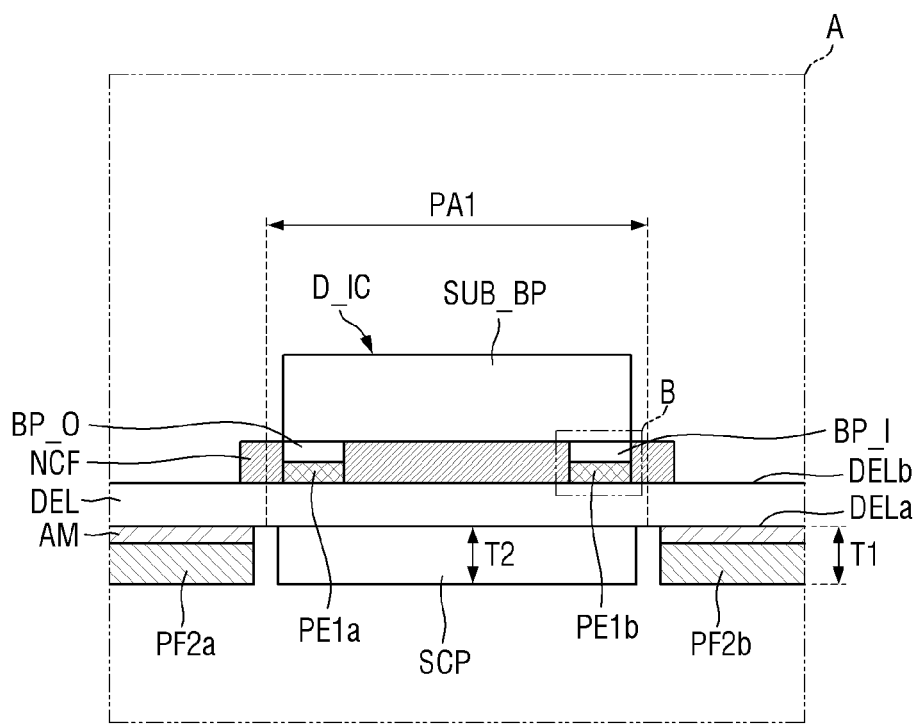
FIG. 7 is an enlarged cross-sectional view of area A of FIG. 2A.

Each of the lower films PF1 and PF2 may be attached to the display element layer DEL through an adhesive member AM (in FIG. 7).

Each of the lower films PF1 and PF2 may support the main area MA and the sub-area SA of the display element layer DEL when the display device according to an embodiment is bent (e.g., in the display device which is bent). The first lower film PF1 may be disposed on one surface of the display element layer DEL in the main area MA that faces the display element layer DEL in the sub-area SA. The second lower film PF2 may be disposed on one surface of the display element layer DEL in the sub-area SA that faces the display element layer DEL in the main area MA.

Each of the lower films PF1 and PF2 may include a material having rigid properties or semi-rigid properties. A rigidity of the lower films PF1 and PF2 may be greater than a rigidity of the step compensation member SCP. Specifically, each of the lower films PF1 and PF2 may be formed of a metal material, such as stainless steel (SUS) or aluminum, or a polymer, such as polymethyl methacrylate (PMMA), polycarbonate (PC), polyvinyl alcohol (PVA), acrylonitrile-butadiene-styrene (ABS), polyethylene terephthalate (PET), or the like. For example, each of the lower films PF1 and PF2 may be a stainless steel film having a thickness of about 150 µm to about 200 µm. In another example, each of the lower films PF1 and PF2 may be an aluminum film having a thickness of about 150 µm to 200 µm. However, materials of the above-described lower films PF1 and PF2 are not limited thereto.

The display panel 100 according to an embodiment may further include a touch sensor layer TSL disposed on the display element layer DEL. The touch sensor layer TSL may be disposed on the display element layer DEL. FIG. 2A illustrates that the touch sensor layer TSL is included in the display panel 100 and is disposed directly on a thin film encapsulation layer 170 (in FIG. 4). Elements disposed "directly" with each other, may form an interface therebetween, without being limited thereto. The touch sensor layer TSL may be disposed in the main area MA. However, unlike FIG. 2A, the touch sensor layer TSL may be prepared as a member provided separately from the display panel 100 including the display element layer DEL and be attached to the display panel 100, such as through an intervening element. In this case, the touch sensor layer TSL may be attached onto the display panel 100 using an additional bonding member.

The cover window WD may be disposed on the touch sensor layer TSL. The cover window WD may include glass or plastic. The cover window WD may be transparent, such as to transmit an image and/or light from the display element layer DEL, to outside the electronic device. The cover window WD may overlap the main area MA of the display panel 100, and a portion of the cover window WD may extend to the bending area BA.

The display panel 100 according to an embodiment may further include an additional member for reducing reflection of external light. Examples of the additional member may include a filter layer FL. The filter layer FL may include color filters. For example, the color filters may include a red color filter, a green color filter, and a blue color filter. Each of the color filters may be disposed in each of light emission areas (e.g., a light emission area provided in plural including a plurality of light emission areas) of the pixels PX of FIG. 1. The filter layer FL may further include a light-blocking pattern positioned between adjacent color filters. The light-blocking pattern may be, for example, a black matrix, but is not limited thereto.

That is, the display panel 100 may further include a filter layer FL disposed on the touch sensor layer TSL. The filter layer FL may serve to reduce reflection of external light incident from an upper portion of the cover window WD (e.g., from outside the electronic device at the front side or display side thereof).

The display panel 100 according to an embodiment may further include a bending protection layer BPL which is disposed on the display element layer DEL in the bending area BA. The bending protection layer BPL may alleviate stress generated in layers at the bending area BA.

A step compensation member SCP may be further disposed in the sub-area SA of the display device according to an embodiment. The step compensation member SCP may be positioned between a second lower film PF2 (second lower films PF2a and PF2b in FIG. 7) divided along the second direction DR2 in cross-sectional view. The second lower films PF2a and PF2b may together define a lower film layer which is disconnected within the pad area (e.g., the first pad area PA1). The step compensation member SCP together with the lower film layer may define a lower layer which is extended along the sub-area SA of the display panel 100 (or along the display element layer DEL at the sub-area SA). The lower layer may include the lower film layer defining an opening at the pad area, the opening exposing a portion of the pad area to outside the lower film layer, and the step compensation member SCP may be in the opening of the lower film layer and on the portion of the pad area which is exposed to outside the lower film layer.

The step compensation member SCP may be positioned on one surface of the display element layer DEL in the sub-area SA that faces the display element layer DEL in the main area MA. The step compensation member SCP may be disposed directly on one surface of the display element layer DEL in the sub-area SA that faces the display element layer DEL in the main area MA. The step compensation member SCP may be disposed between the first lower film PF1 and the display element layer DEL.

Figure 2B:
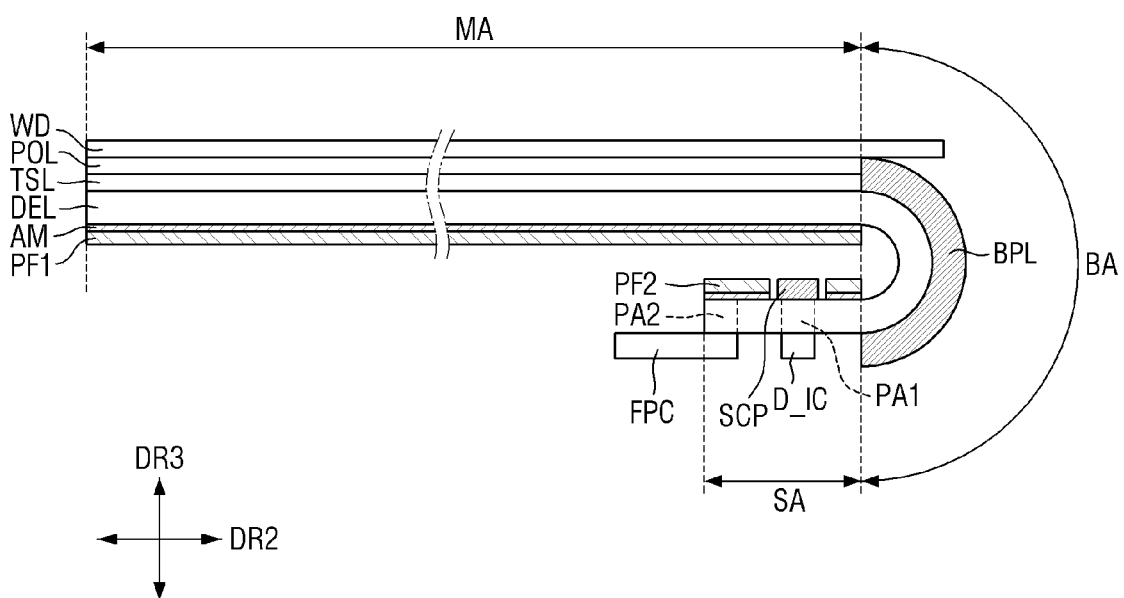
FIG. 2B is a cross-sectional view of a display device according to an embodiment.

FIG. 2B is a cross-sectional view of a display device according to an embodiment. In FIG. 2B, the additional member for reducing reflection of external light is a polarizing member POL. The polarizing member POL may be positioned between the touch sensor layer TSL and the cover window WD and may serve to reduce reflection of external light incident from the upper portion of the cover window WD. The polarizing member POL may be attached to the touch sensor layer TSL using an additional adhesive layer or sticky layer. The polarizing member POL may be disposed in the main area MA.

Figure 3:
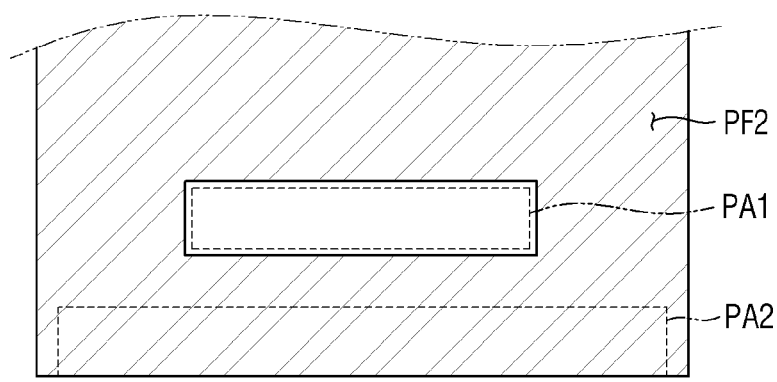
FIG. 3 is a plan view of a second lower film of the display device of FIG. 1.
Figure 3:
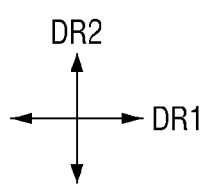

FIG. 3 is a plan view of a second lower film PF2 of the display device of FIG. 1.

Referring to FIGS. 2A, 2B and 3, the second lower film PF2 may not be disposed in a region of the sub-area SA which overlaps (or corresponds to) the driving integrated circuit D_IC in the thickness direction. That is, the second lower film PF2 may not overlap the first pad area PA1. In an embodiment, the second lower film PF2 completely surrounds the pad area (e.g., the first pad area PA1) in the plan view.

Figure 9:
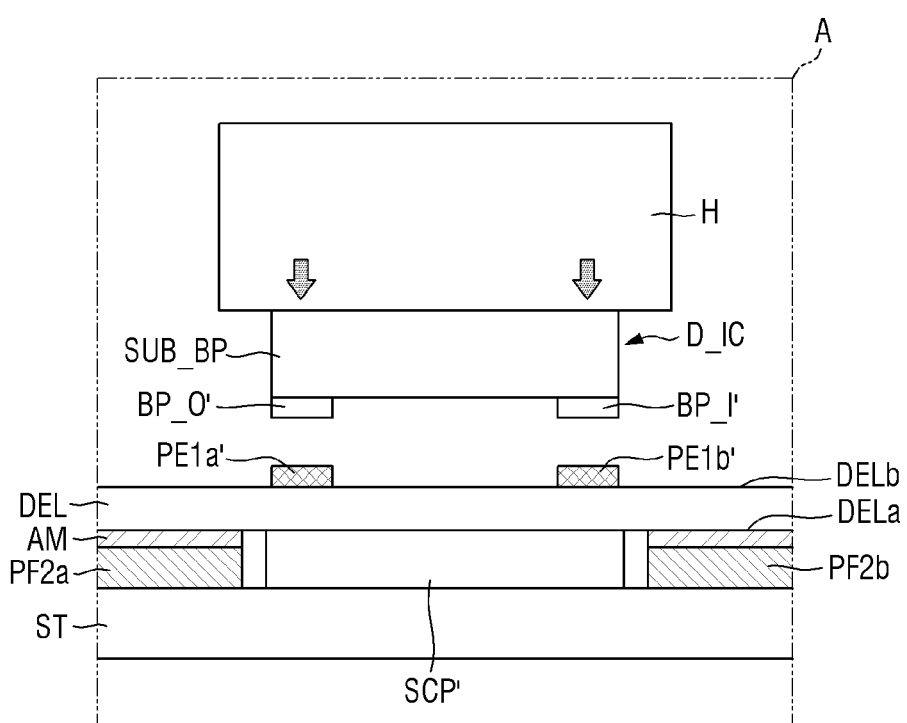
FIGS. 9 to 11 are cross-sectional views showing processes of a method of ultrasonically bonding a driving chip to a first pad area according to an embodiment.

Bumps of the driving integrated circuit D_IC and the pad electrodes of the first pad area PA1 may be ultrasonically bonded to each other (e.g., a direct bond), and the ultrasonic bonding may be performed through a bonding device H (in FIG. 9). The bonding device H transfers vibration energy to the bumps of the driving integrated circuit D_IC while moving with ultrasonic vibrations, and while the bumps receiving the vibration energy move in the vibration direction with respect to the facing pad electrodes, frictional heat is generated between the pad electrodes and the bumps. The bumps and the pad electrodes facing each other may be directly bonded to each other by the frictional heat.

However, in the first pad area PA1, when the second lower film PF2 is further disposed under or below the display panel 100, the frictional heat generated between the bumps and the pad electrodes may be absorbed by the second lower film PF2 without being used solely for bonding the bumps and pad electrodes facing each other.

Accordingly, in the display device according to the embodiment, the second lower film PF2 does not overlap the first pad area PA1, so that the frictional heat generated between the bumps and the pad electrodes is used only for bonding the bumps and the pad electrodes facing each other, thereby increasing bonding efficiency.

Figure 4:
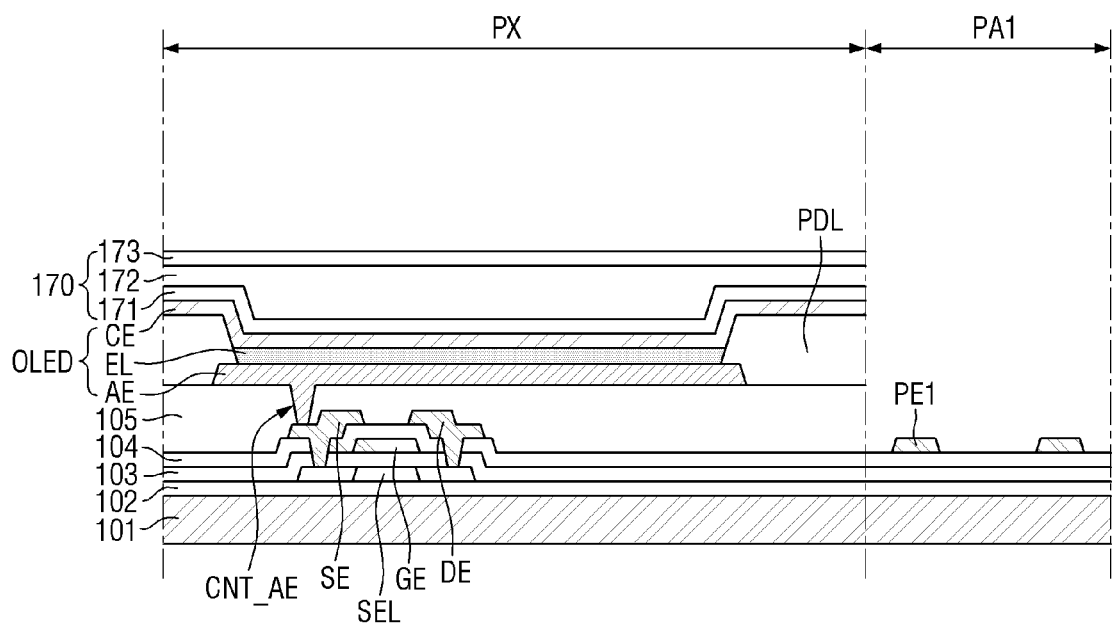
FIG. 4 is a cross-sectional view of a pixel and a first pad area of FIG. 1.

FIG. 4 is a cross-sectional view of a pixel PX and a first pad area PA1 of FIG. 1. FIG. 4 illustrates a detailed cross-sectional view of the display element layer DEL of FIG. 2A.

Referring to FIG. 4, the display element layer DEL (of FIG. 2A) according to an embodiment may include a base substrate 101, a buffer layer 102, the active layer SEL, a gate insulating layer 103, a gate conductive layer 120 (e.g., a first conductive layer) including a gate electrode GE, an interlayer insulating layer 104, a data conductive layer 130 (e.g., a second conductive layer) including a source electrode SE, a drain electrode DE, a first pad electrode PE1, and a second pad electrode PE2 (of FIG. 5), a via layer 105, an organic light-emitting element OLED as a light emitting element (or a display element), a pixel defining layer PDL, and a thin film encapsulation layer 170 (e.g., an encapsulation layer).

The buffer layer 102, the active layer SEL, the gate insulating layer 103, the gate conductive layer 120, the interlayer insulating layer 104, and the data conductive layer 130 together constitute a circuit element layer. The pixel defining layer PDL and the organic light-emitting element OLED may constitute a light-emitting element layer. The circuit element layer may be connected to the light-emitting element layer to generate and/or emit light, display an image, etc.

The base substrate 101 may include a transparent insulating substrate. For example, the base substrate 101 may be a flexible transparent resin substrate. The transparent resin substrate may include a polyimide-based resin, an acryl-based resin, a polyacrylate-based resin, a polycarbonate-based resin, a polyether-based resin, a sulfonic acid-based resin, or a polyethyleneterephthalate-based resin. Preferably, the base substrate 101 may be a polyimide (PI) resin film. However, the material of the above-described transparent resin substrate is not limited thereto.

The buffer layer 102 may prevent diffusion of metal atoms or impurities from the base substrate 101, and may adjust heat transfer rate of a subsequent crystallization process for the active layer SEL, which will be described below, thereby obtaining the substantially uniform active layer SEL. In addition, the buffer layer 102 may serve to improve the surface flatness of the base substrate 101 when the surface of the base substrate 101 is not uniform. The buffer layer 102 may be formed using a silicon compound, such as a silicon oxide ($SiO_x$), a silicon nitride ($SiN_x$), a silicon oxynitride ($SiO_xN_y$), a silicon oxycarbide ($SiO_xC_y$), or silicon carbonitride ($SiC_xN_y$).

Although not illustrated, the buffer layer 102 may not be formed in the bending area BA (e.g., may be absent from the bending area BA or disconnected at the bending area BA). That is, the buffer layer 102 may not be formed in the bending area BA, or a portion of the buffer layer 102 may be removed in a method of providing the electronic device. The bending area BA is a folded part of the final electronic device, so when the buffer layer 102 which is an inorganic layer, is formed in the bending area BA, damage such as cracks may occur in the buffer layer 102. Likewise, the insulating layers 103 and 104 formed as inorganic layers may not be formed in the bending area BA. However, in some embodiments, the buffer layer 102 or the insulating layers 103 and 104 may be formed (or provided) in the bending area BA.

The active layer SEL may be disposed on the buffer layer 102. The active layer SEL may include a drain region doped with impurities, a source region doped with impurities, and a channel region between the drain region and the source region.

The gate insulating layer 103 may be disposed on the buffer layer 102 on which the active layer SEL is disposed (e.g., having the active layer SEL thereon). The gate insulating layer 103 may include a silicon compound, a metal oxide, or the like.

The gate conductive layer 120 may be disposed on the gate insulating layer 103. The gate conductive layer 120 may include a gate electrode GE of a thin film transistor, a signal line such as a gate line for transmitting a signal for driving a pixel PX, and the like. The gate electrode GE, the gate line, etc. may be respective patterns of the gate conductive layer 120. The gate conductive layer 120 may be formed (or provided) using a metal, an alloy, a metal nitride, a conductive metal oxide, a transparent conductive material, or the like. For example, the gate conductive layer 120 may be formed of a metal, such as copper, aluminum, or molybdenum. Also, the gate conductive layer 120 may have a multilayered structure. For example, the gate conductive layer 120 may include a copper layer and a molybdenum layer on the copper layer.

The interlayer insulating layer 104 may be disposed on the gate conductive layer 120. The interlayer insulating layer 104 may be formed using a silicon compound, such as a silicon oxide ($SiO_x$), a silicon nitride ($SiN_x$), a silicon oxynitride ($SiO_xN_y$), a silicon oxycarbide ($SiO_xC_y$), or silicon carbonitride ($SiC_xN_y$).

The data conductive layer 130 may be disposed on the interlayer insulating layer 104. The data conductive layer 130 may include the source electrode SE, the drain electrode DE, the first pad electrodes PE1, the second pad electrode PE2, and the like. The various electrodes may be respective patterns of the data conductive layer 130.

The source electrode SE may be connected to the source region through a contact hole penetrating the interlayer insulating layer 104 and the gate insulating layer 103, and the drain electrode DE may be connected to the drain region through a contact hole penetrating the interlayer insulating layer 104 and the gate insulating layer 103.

The data conductive layer 130 may be formed using a metal, an alloy, a metal nitride, a conductive metal oxide, a transparent conductive material, or the like. For example, the data conductive layer 130 may be formed of a high conductive metal, such as copper, aluminum, or the like. The data conductive layer 130 may have a multilayered structure. For example, the data conductive layer 130 may include a titanium layer, an aluminum layer on the titanium layer, and titanium layer on the aluminum layer.

The via layer 105 may be disposed on the interlayer insulating layer 104 on which the data conductive layer 130 is disposed. The via layer 105 may include an organic insulating material, and may have a substantially flat top surface that sufficiently covers the data conductive layer 130. In some embodiments, the via layer 105 may include an inorganic insulating material.

The organic light-emitting element OLED may include a first electrode AE (or an anode electrode), a organic light-emitting layer EL, and a second electrode CE (or a cathode electrode).

The anode electrode AE may be disposed on the via layer 105. The anode electrode AE may be electrically connected to the source electrode SE via a contact hole CNT_AE formed through (or defined in) the via layer 105. The source electrode SE may be exposed to outside the via layer 105 by the contact hole CNT_AE.

The anode electrode AE may be formed using a reflective material or a light-transmitting material. For example, the anode electrode AE may include aluminum, an alloy containing aluminum, aluminum nitride, silver, an alloy containing silver, tungsten, tungsten nitride, copper, an alloy containing copper, nickel, chromium, chromium nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, and the like. These materials may be used alone or in combination with each other. In embodiments, the anode electrode AE may have a single-layer structure or a multi-layer structure including a metal film, an alloy film, a metal nitride film, a conductive metal oxide film, and/or a transparent conductive material film.

The pixel defining layer PDL may be disposed on the via layer 105 on which the anode electrode AE is disposed. The pixel defining layer PDL may be formed using an organic material, an inorganic material, or the like. For example, the pixel defining layer PDL may be formed using a photoresist, a polyacrylic resin, a polyimide-based resin, an acrylic resin, a silicon compound, or the like. In embodiments, an opening that partially exposes the anode electrode AE to outside the pixel defining layer PDL may be formed by etching the pixel defining layer PDL.

The organic light-emitting layer EL may be disposed on the anode electrode AE exposed to outside the pixel defining layer PDL, through the opening of the pixel defining layer PDL. Also, the organic light-emitting layer EL may extend along a side wall of the pixel defining layer PDL which defines the opening of the pixel defining layer PDL. In embodiments, the organic light-emitting layer EL may have a multilayer structure including an organic layer, a hole injection layer, a hole transport layer, an electron transport layer, an electron injection layer, and the like.

In an embodiment, the hole injection layer, the hole transport layer, the electron transport layer, and the electron injection layer, excluding the organic layer, may be commonly formed corresponding to the plurality of pixels PX.

The organic layer of the organic light-emitting layer EL may be formed using light-emitting materials capable of generating and emitting different color lights, such as a red color light, a green color light, and a blue color light, depending on each pixel PX of the display device. According to other embodiments, the organic layer of the organic light-emitting layer EL may have a structure which includes a plurality of stacked light-emitting materials capable of implementing different color lights, such as a red color light, a green color light, and a blue color light to thereby emit a white color light. Here, the light-emitting structures may be commonly formed corresponding to the plurality of pixels PX, and each of the pixels PX may be divided by a color filter layer.

The second electrode CE (or the cathode electrode) may be disposed on the pixel defining layer PDL and the organic light-emitting layer EL. According to the light emission method of the display device, the second electrode CE may include a light-transmitting material or a reflective material. For example, the second electrode CE may include aluminum, an alloy containing aluminum, aluminum nitride, silver, an alloy containing silver, tungsten, tungsten nitride, copper, an alloy containing copper, nickel, chromium, chromium nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, and the like. These materials may be used alone or in combination with each other. In embodiments, the second electrode CE may have a single-layer structure or a multi-layer structure including a metal film, an alloy film, a metal nitride film, a conductive metal oxide film, and/or a transparent conductive material film.

The thin film encapsulation layer 170 may be disposed on the second electrode CE. The thin film encapsulation layer 170 may prevent infiltration of moisture and oxygen from the outside (e.g., outside of the electronic device), to various layers and components underlying the thin film encapsulation layer 170 (e.g., at an interior of the display device). The thin film encapsulation layer 170 may include at least one organic layer and at least one inorganic layer. At least one organic layer 172 and at least one inorganic layer 171 and 173 may be alternately stacked on top of each other. For example, the thin film encapsulation layer 170 may include two inorganic layers 171 and 173 and one organic layer 172 interposed therebetween, but is not limited thereto. In an embodiment, instead of the thin film encapsulation layer 170, a sealing substrate for blocking infiltration of external air and moisture into the interior of the display device may be provided.

Figure 5:
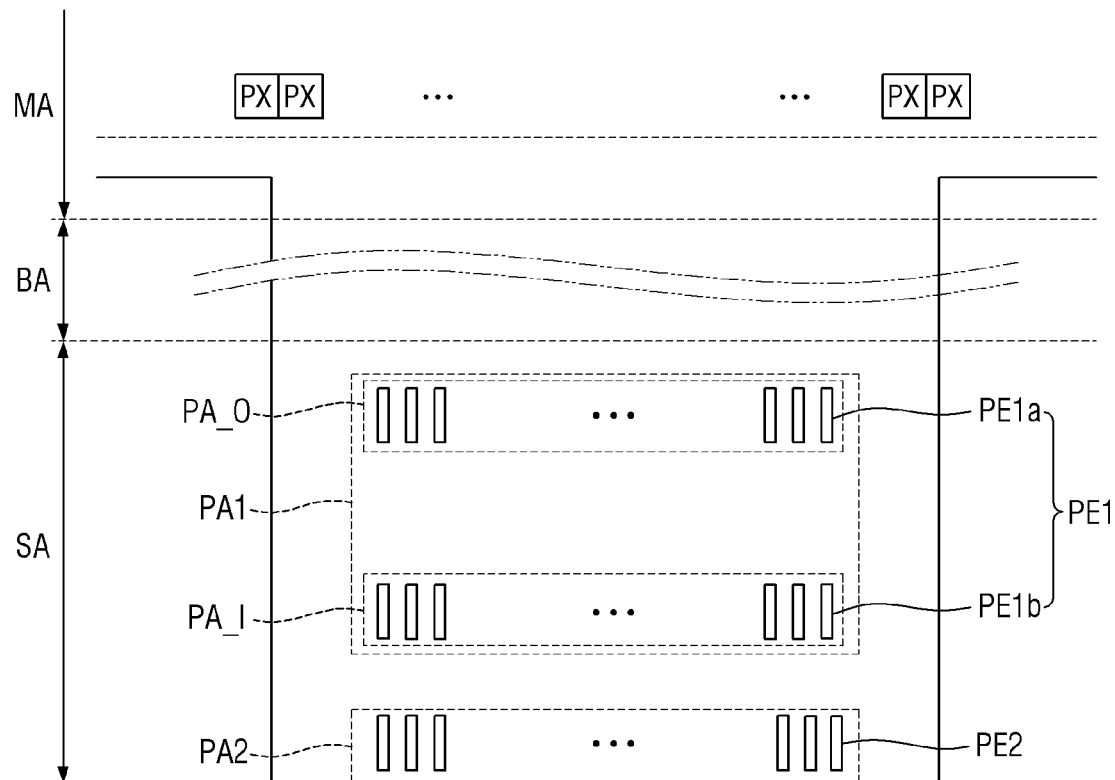
FIG. 5 is an enlarged plan view illustrating an embodiment of a main area, a bending area, and a sub-area of the display device of FIG. 1.

FIG. 5 is a plan view illustrating in more detail a main area MA, a bending area BA, and a sub-area SA of the display device of FIG. 1.

Referring to FIG. 5, the first pad area PA1 may include an output pad area PA_O and an input pad area PA_I. The output pad area PA_O is adjacent to the display area DA (in FIG. 1) in which a plurality of pixels PX are disposed, and a plurality of output pad electrodes PE1a are disposed in the output pad area PA_O. The input pad area PA_I is positioned below the output pad area PA_O in a plan view and further from the display area DA than the output pad area PA_O, and a plurality of input pad electrodes PE1b are disposed in the input pad area PA_I. The output pad electrodes PE1a and the input pad electrodes PE1b may together constitute the first pad electrodes PE1. In an embodiment, where the display element layer DEL represents the display panel 100, the first pad electrodes PE1 may be considered as protruded from the display panel 100, without being limited thereto.

The plurality of output pad electrodes PE1a and the plurality of input pad electrodes PE1b may be respectively arranged spaced apart from each other in the first direction DR1. The input pad area PA_I may be positioned below the output pad area PA_O in the second direction DR2, relative to the display area DA above the first pad area PA1. In some embodiments, the input pad area PA_I may be positioned above the output pad area PA_O in the second direction DR2.

Figure 6:
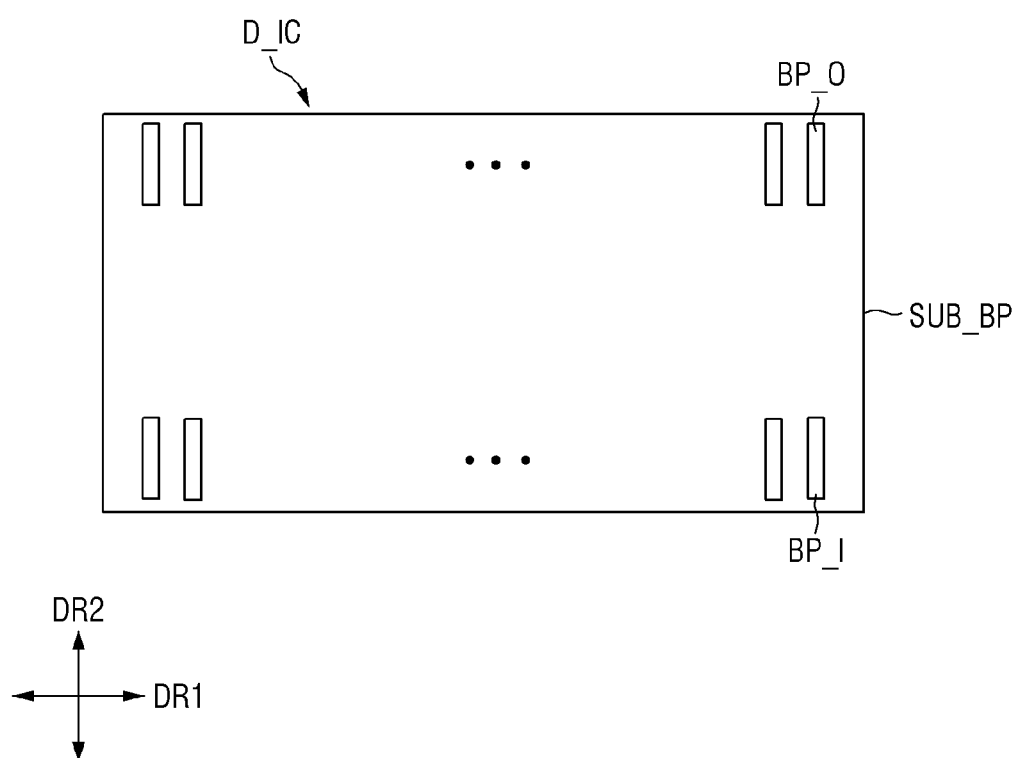
FIG. 6 is a plan view of a driving chip of FIG. 1.

FIG. 6 is a plan view of a driving chip of FIG. 1.

Referring to FIG. 6, the driving integrated circuit D_IC (in FIG. 1) may include a circuit base part SUB_BP (e.g., a base layer), and a plurality of bumps BP_O and BP_I disposed on the circuit base part SUB_BP. The driving integrated circuit D_IC may be implemented in the form of a driving chip. The plurality of bumps BP_O and BP_I may include output bumps BP_O and input bumps BP_I. The driving integrated circuit D_IC may include an output bump area in which output bumps BP_O are disposed and an input bump area in which input bumps BP_I are disposed. The output bump area may overlap the output pad area PA_O of FIG. 5, and the input bump area may overlap the input pad area PA_I of FIG. 5. The output bump BP_O may be connected to the output pad electrode PE1a, and the input bump BP_I may be connected to the input pad electrode PE1b.

Figure 8:
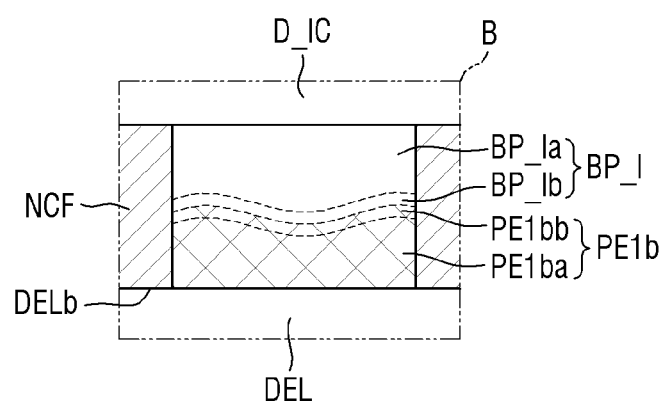
FIG. 8 is an enlarged cross-sectional view of area B of FIG. 7.

FIG. 7 is an enlarged cross-sectional view of area A of FIG. 2A. FIG. 8 is an enlarged cross-sectional view of area B of FIG. 7.

Referring to FIGS. 7 and 8, the display element layer DEL may include one surface DELb facing the driving integrated circuit D_IC (e.g., closest to the driving integrated circuit D_IC), and the other surface DELa opposite to the one surface DELb. The first pad electrodes PE1 may be disposed on the one surface DELb. The first pad electrodes PE1 and the bumps BP_O and BP_I may be directly bonded to each other. The output pad electrode PE1a and the input pad electrode PE1b may be ultrasonically bonded to the bumps BP_O and BP_I (e.g., directly connected to each other by an ultrasonic bond or direct bond), respectively. That is, as shown in FIG. 8, an intermediate layer may be further disposed between an area PE1ba made of only the material of the input pad electrode PE1b and an area BP_Ia made only of the material of the input bump BP_I. The intermediate layer may be a region in which both the material of the input pad electrode PE1b and the material of the input bump BP_I are included.

As shown in FIG. 8, the input pad electrode PE1b may include the area PE1ba made of only the material of the input pad electrode PE1b, and a lower region PE1bb of the intermediate layer, and the input bump BP_I may include the area BP_Ia made of only the material of the input bump BP_I and an upper region BP_Ib of the intermediate layer. The upper region BP_Ib and the lower region PE1bb of the intermediate layer, in each of which the material of the input bump BP_I and the material of the input pad electrode PE1b are both included, have the same constituent materials as each other and may define a direct bond. For convenience of description, the upper region BP_Ib and the lower region PE1bb of the intermediate layer are used to distinguish the boundary of the input pad electrode PE1b and the input bump BP_I. That is, the upper region BP_Ib together with the lower region PE1bb define the intermediate layer and may be considered an interface of the respective pad electrode and respective bump.

A non-conductive adhesive member NCF (e.g., non-conductive film) may be further disposed between adjacent input bumps BP_I and between adjacent input pad electrodes PE1b. The non-conductive adhesive member NCF may be in direct contact with the side surface of the ultrasonically bonded input bump BP_I and input pad electrode PE1b. For example, the non-conductive adhesive member NCF may be positioned between the drive integrated circuit D_IC (e.g., the drive chip) and the display panel 100.

The second lower films PF2a and PF2b are disposed on the other surface DELa of the display element layer DEL. As described above, the second lower films PF2a and PF2b may be attached to the other surface DELa of the display element layer DEL using the adhesive member AM. The second lower films PF2 may be spaced apart from each other with the first pad area PA1 interposed therebetween (see PF2a and PF2b). The step compensation member SCP is disposed on the other surface DELa of the first pad area PA1 of the display element layer DEL.

The second thickness T2 of the step compensation member SCP may be equal to the first thickness T1 as a sum of the thickness of the second lower films PF2a and PF2b and the thickness of the adhesive member AM. That is, the surface height of the step compensation member SCP may be the same as the surface height of the adjacent second lower films PF2a and PF2b. That is to say, the surface of the step compensation member SCP may be located on the same line as the surfaces of the adjacent second lower films PF2a and PF2b, to define the surfaces coplanar with each other. In an embodiment, each of the step compensation member SCP and the lower film layer (e.g., the second lower films PF2a and PF2b) has a surface which is furthest from the display panel 100 (or the display element layer DEL as representing the display panel 100), and the surface of the step compensation member SCP is coplanar with the surface of the lower film layer.

The step compensation member SCP may include a resin. The step compensation member SCP may include a thermosetting resin. The thermosetting resin may be cured in the process of applying heat pressure downward to the driving integrated circuit D_IC using the bonding device H (in FIG. 9), as will be described below. The step compensation member SCP may be spaced apart from the adjacent second lower films PF2a and PF2b by a predetermined distance, in a direction along the display element layer DEL (e.g., along the first direction DR1 and/or the second direction DR2). However, the present disclosure is not limited thereto, and the step compensation member SCP may be in direct contact with the adjacent second lower films PF2a and PF2b.

Figure 10:
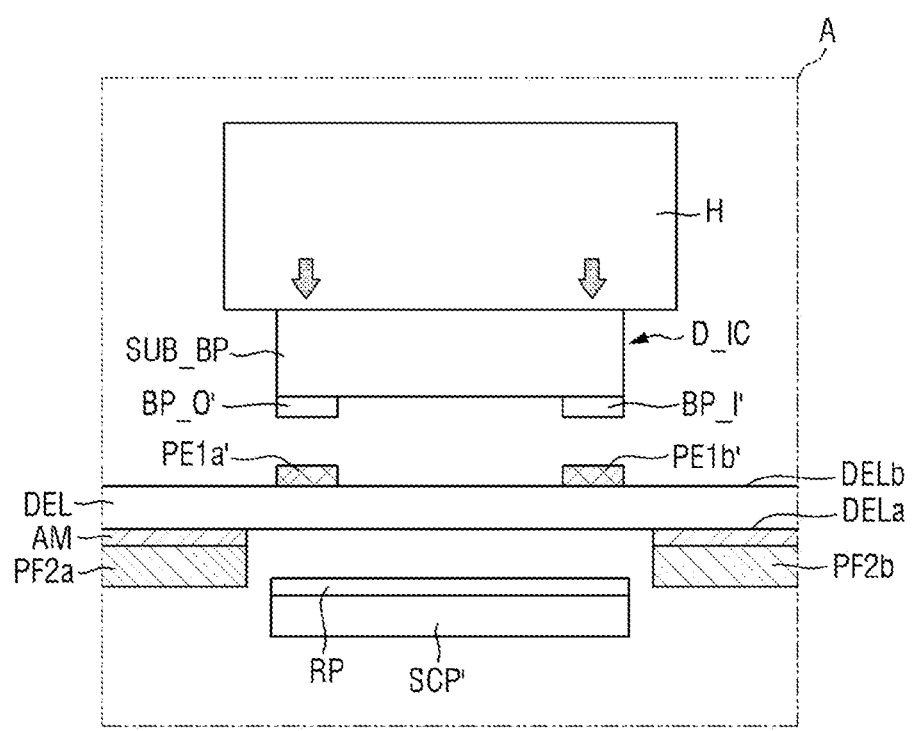

As shown in FIGS. 9 and 10, in a method of providing a display device (or electronic device), the driving integrated circuit D_IC provided with a plurality of bumps BP_O' and BP_I' (e.g., preliminary bumps BP_O' and BP_I'), is disposed on preliminary first pad electrodes PE1' including first pad electrodes PE1a' and PE1b' (e.g., preliminary first pad electrodes). Direct bonding of preliminary forms of the bumps and electrodes to each other may form the bump-pad electrode structure shown in FIG. 8 having the intermediate layer together with upper and lower portions of a direct-bonded body of the bump and pad electrode. Although not illustrated, before the driving integrated circuit D_IC is disposed, an operation of preparing a target display device including the first lower film PF1 and the second lower films PF2a and PF2b described with reference to FIGS. 2A and 7 is performed. The operation of disposing the driving integrated circuit D_IC may include disposing the step compensation member SCP' on the other surface DELa of the first pad area PA1 of the display element layer DEL, and bonding the bumps BP_O' and BP_I' and the first pad electrodes PE1a' and PE1b', respectively to each other.

Between the operation of disposing the step compensation member SCP' on the other surface DELa of the first pad area PA1 of the display element layer DEL and the operation of bonding the bumps BP_O' and BP_I' and the first pad electrodes PE1a' and PE1b', an operation of disposing a stage ST under or below the step compensation member SCP' and the second lower films PF2a and PE2b may be further included. The operation of disposing the stage ST under or below the step compensation member SCP' and the second lower films PF2a and PE2b may be performed in a state in which the lower surfaces of the step compensation member SCP' and the second lower films PF2a and PE2b are in direct contact with the stage ST.

When the vibration energy described above is applied while heat pressure is applied downward (indicated by the downward arrows in FIGS. 9 and 10) from an upper portion of the driving integrated circuit D_IC using the bonding device H, the bumps BP_O' and BP_I' and the first pad electrodes PE1a' and PE1b' may be directly bonded by the above-described frictional heat at the interface between the preliminary bumps and preliminary first pad electrodes. The bonding device H may apply the heat pressure downward to the driving integrated circuit D_IC while overlapping the first pad area PA1 (in FIG. 7) and the driving integrated circuit D_IC.

During the ultrasonic bonding process, since the bonding device H applies heat pressure downward to the driving integrated circuit D_IC while overlapping the driving integrated circuit D_IC in the first pad area PA1, the pressure may also be transmitted to the first pad area PA1 of the display element layer DEL. Since the second lower films PF2a and PF2b are respectively disposed under or below the display element layer DEL but outside of the first pad area PA1, cracks are less likely to be formed by the transferred pressure.

During a conventional ultrasonic bonding process, cracks may occur in the first pad area PA1 of the display element layer DEL. However, in the display device according to an embodiment, the step compensation member SCP' is disposed on the other surface DELa of the first pad area PA1 of the display element layer DEL. With the step compensation member SCP', when the bonding device H applies the heat pressure downward to the driving integrated circuit D_IC while overlapping the driving integrated circuit D_IC in the first pad area PA1 during the ultrasonic bonding process, the heat pressure is also transmitted to the step compensation member SCP' of the first pad area PA1 of the display element layer DEL, and thereby the occurrence of cracks may be minimized. The step compensation member SCP' may remain in the final display device, without being limited thereto.

Figure 11:
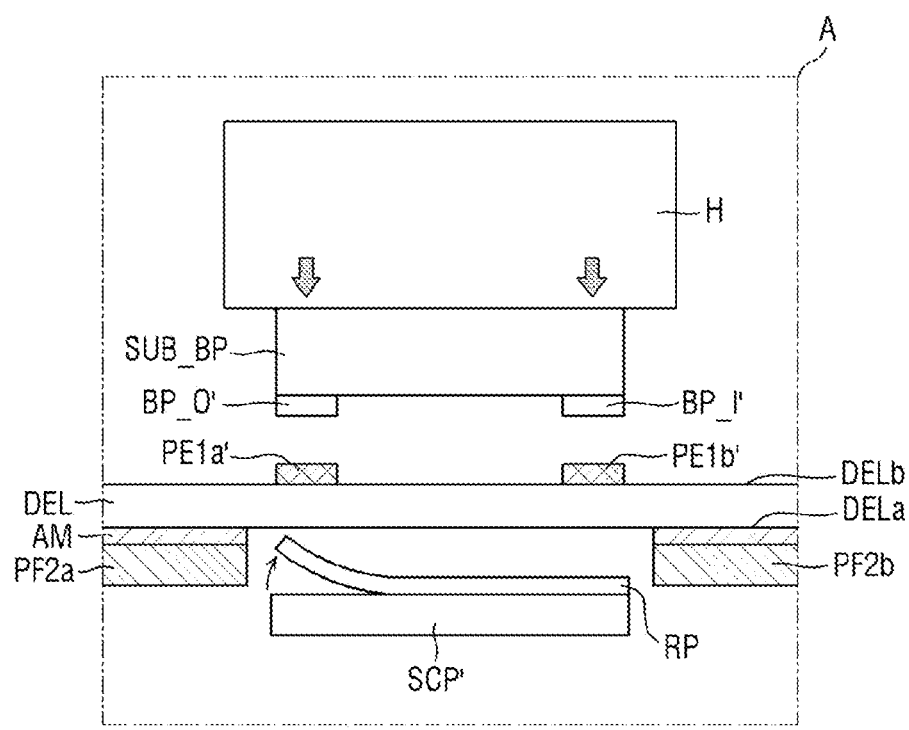

As shown in FIGS. 10 and 11, the operation of disposing the step compensation member SCP' may further include providing a release film RP on a surface of the step compensation member SCP' (in FIG. 10), removing the release film RP from the step compensation member SCP' (in FIG. 11) and providing a step compensation member SCP' from which the release film RP has been removed on a portion of the first pad region PA1 exposed to the outside of the second lower films PF2a and PF2b. In addition, the step compensation member SCP' may be omitted from the final display device, without being limited thereto.

Hereinafter, other embodiments will be described.

Figure 12:
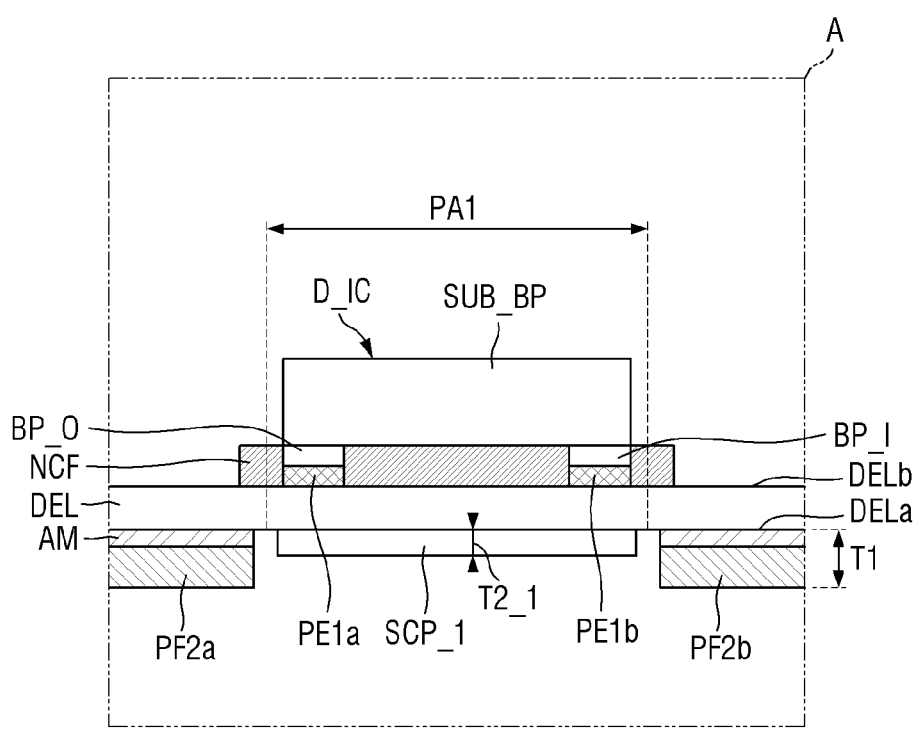
FIG. 12 is a cross-sectional view of a first pad area according to an embodiment.
Figure 13:
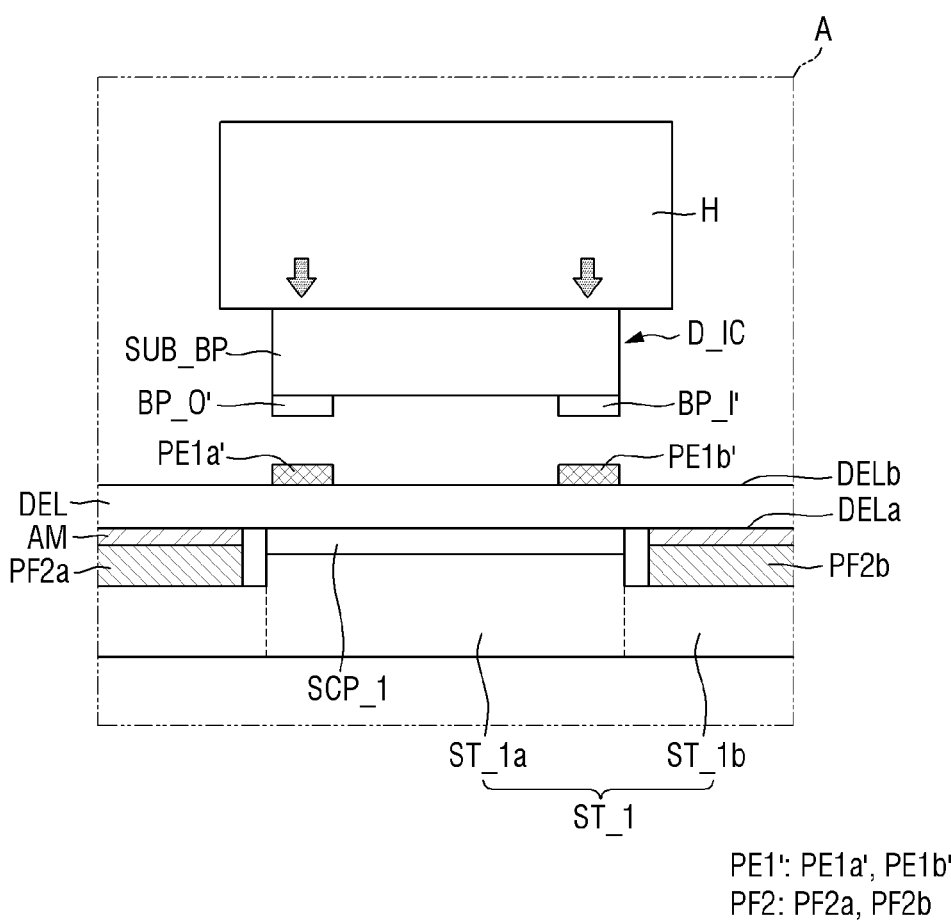
FIG. 13 is a cross-sectional view showing a processing step of ultrasonically bonding a driving chip to the first pad area shown in FIG. 12.

FIG. 12 is a cross-sectional view of a first pad area PA1 according to an embodiment. FIG. 13 is a cross-sectional view showing a process of ultrasonically bonding a driving chip to the first pad area PA1 shown in FIG. 12.

Referring to FIGS. 12 and 13, a step compensation member SCP_1 according to the current embodiment is different from the step compensation member SCP shown in FIG. 7 in that the second thickness T2_1 of the step compensation member SCP_1 is less than the first thickness T1 as the sum of the thickness of the adhesive member AM and the thickness of the second lower films PF2a and PF2b.

More specifically, the second thickness T2_1 of the step compensation member SCP_1 according to the current embodiment may be less than the first thickness T1 as the sum of the thickness of the adhesive member AM and the thickness of the second lower films PF2a and PF2b. That is, the surface of the step compensation member SCP_1 may be located closer to the other surface DELa of the display element layer DEL than the surfaces of the second lower films PF2a and PF2b.

The step compensation member SCP_1 according to the current embodiment may include a metal. The step compensation member SCP_1 may be formed directly on the other surface DELa of the display element layer DEL.

Even in the current embodiment, the step compensation member SCP_1 is disposed on the other surface DELa of the first pad area PA1 of the display element layer DEL. With the step compensation member SCP_1, when the bonding device H applies heat pressure downward to the driving integrated circuit D_IC while overlapping the driving integrated circuit D_IC in the first pad area PA1 during the ultrasonic bonding process, the heat pressure is also transmitted to the step compensation member SCP_1 of the first pad area PA1 of the display element layer DEL, and thereby the occurrence of cracks may be minimized.

As shown in FIG. 13, the operation of disposing the driving integrated circuit D_IC may include disposing the step compensation member SCP_1 on the other surface DELa of the first pad area PA1 of the display element layer DEL, and bonding the bumps BP_O' and BP_I' and the first pad electrodes PE1a' and PE1b'. Between the operation of disposing the step compensation member SCP_1 on the other surface DELa of the first pad area PA1 of the display element layer DEL and the operation of bonding the bumps BP_O' and BP_I' and the first pad electrodes PE1a' and PE1b', an operation of disposing a stage ST_1 under or below the step compensation member SCP_1 and the second lower films PF2a and PE2b may be further included. In the operation of disposing the stage ST_1 under or below the step compensation member SCP_1 and the second lower films PF2a and PE2b, the stage ST_1 may include a central part ST_1a overlapping the first pad area PA1, and an outer part ST_1b overlapping each of the second lower films PF2a and PF2b. The surface of the central part ST_1a may protrude toward the display element layer DEL further than the surface of the outer part ST_1b (the thickness of the central part ST_1a is greater than the thickness of the outer part ST_1b). That is, a step created between the step compensation member SCP_1 and the second lower films PF2a and PF2b due to the surface of the step compensation member SCP_1 being located closer to the other surface DELa of the display element layer DEL than the surfaces of the second lower films PF2a and PF2b may be compensated for by the stage ST_1. Accordingly, the stage ST_1 may be simultaneously in direct contact with both the lower surfaces of the step compensation member SCP_1 and the second lower films PF2a and PE2b.

Figure 14:
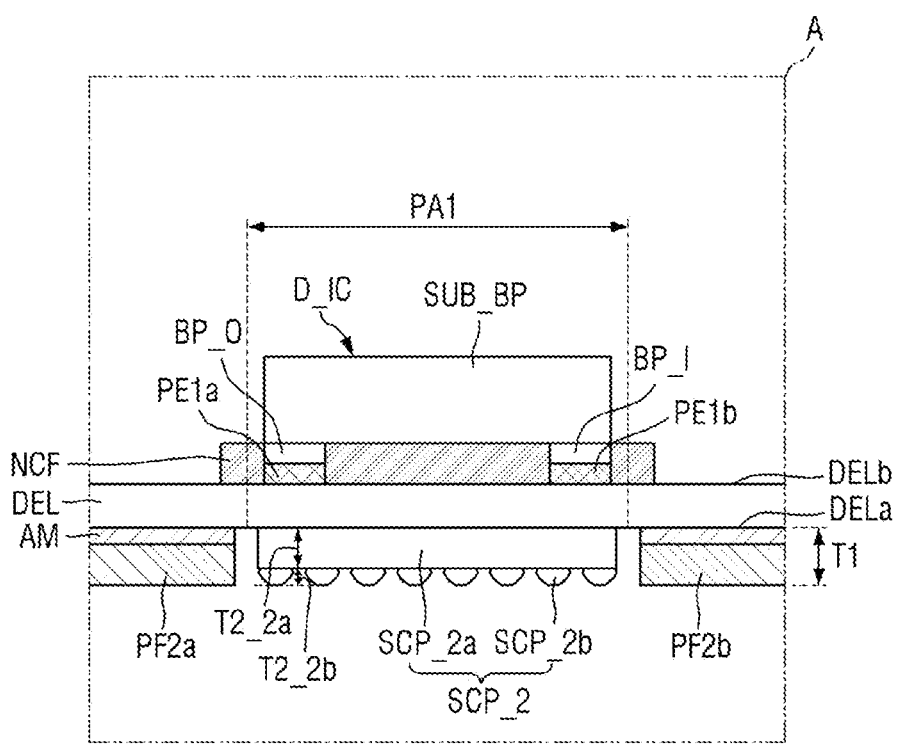
FIG. 14 is a cross-sectional view of a first pad area according to an embodiment.
Figure 15:
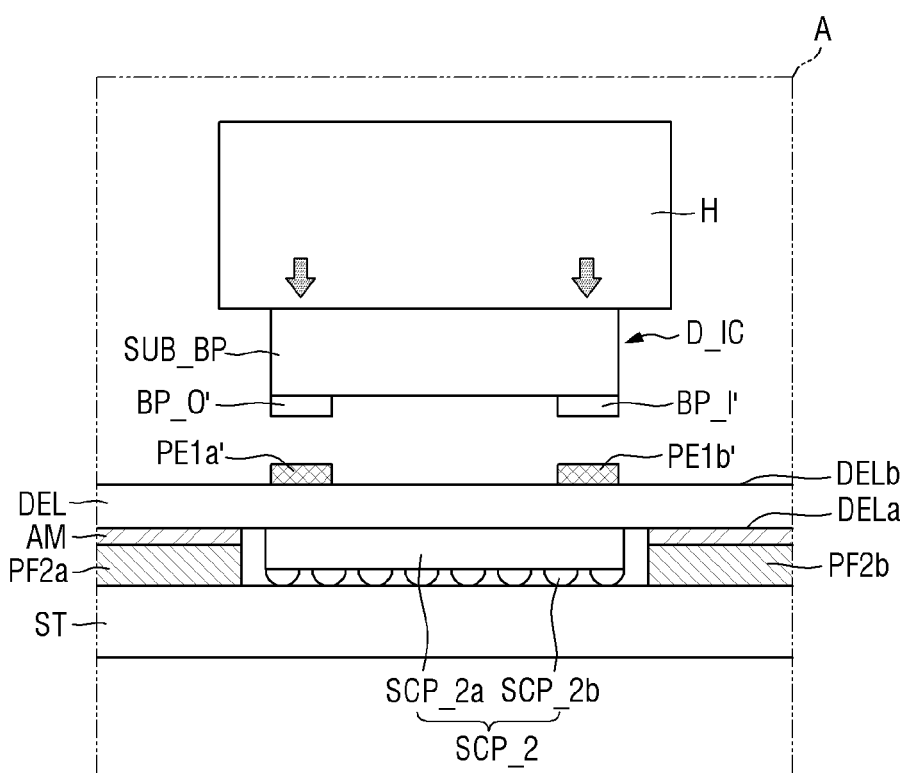
FIG. 15 is a cross-sectional view showing a processing step of ultrasonically bonding a driving chip to the first pad area shown in FIG. 14.

FIG. 14 is a cross-sectional view of a first pad area PA1 according to an embodiment. FIG. 15 is a cross-sectional view showing a process of ultrasonically bonding a driving chip to the first pad area PA1 shown in FIG. 14.

Referring to FIGS. 14 and 15, the step compensation member SCP_2 according to the current embodiment is different from the step compensation member SCP shown in FIG. 7 in that the step compensation member SCP_2 includes a base part SCP_2a as a base layer, and a plurality of protrusion parts SCP_2b which protrude from the surface of the base part SCP_2a in a direction away from the driving chip and toward a main area MA in the display device which is bent. In an embodiment, the step compensation member SCP_2 may include in order from the display panel 100 (or the display element layer DEL as representing the display panel 100), a base layer (e.g., the base part SCP_2a), and a protrusion layer including a plurality of protrusion parts SCP_2b each protruding from the base layer and in a direction away from the driving chip.

Although the base part SCP_2a and the protrusion parts SCP_2b according to the current embodiment are illustrated as being separated from each other in the drawings, the present disclosure is not limited thereto, the base part SCP_2a and the protrusion parts SCP_2b may be integrally formed and may include the same material. In this case, each of the base part SCP_2a and the protrusion parts SCP_2b may include a thermosetting resin. The sum of the thickness T2_2a of the base part SCP_2a and the thickness T2_2b of the protrusion part SCP_2b may be equal to the sum of the thickness of the adhesive member AM and the thickness of the second lower films PF2a and PF2b, but is not limited thereto.

The step compensation member SCP_2 according to the current embodiment may be manufactured by forming the base part SCP_2a (primary deposition) and then forming the protrusion parts SCP_2b (secondary deposition), or by forming a step compensation material (primary deposition), followed by forming the protrusion parts SCP_2b by etching.

According to the current embodiment, the step compensation member SCP_2 includes the base part SCP_2a and the plurality of protrusion parts SCP_2b protruding from the surface of the base part SCP_2a toward the main area MA. The protrusion parts SCP_2b serve as buffers when bumps BP_O' and BP_I' and first pad electrodes PE1a' and PE1b' are bonded to each other in the process of disposing the driving integrated circuit D_IC. Thus, even when a stage ST is not flat, the protrusion parts SCP_2b may serve to correct the non-flatness of the stage ST, thereby improving the bonding quality.

Referring to FIGS. 14 and 15, ends (e.g., distal ends) of the plurality of protrusion parts SCP_2b are aligned with each other. Lower surfaces of the second lower films PF2a and PF2b are furthest from the display element layer DEL and aligned with each other. In an embodiment, the ends of the plurality of protrusion parts SCP_2b are coplanar with the lower surfaces of the second lower films PF2a and PF2b.

Figure 16:
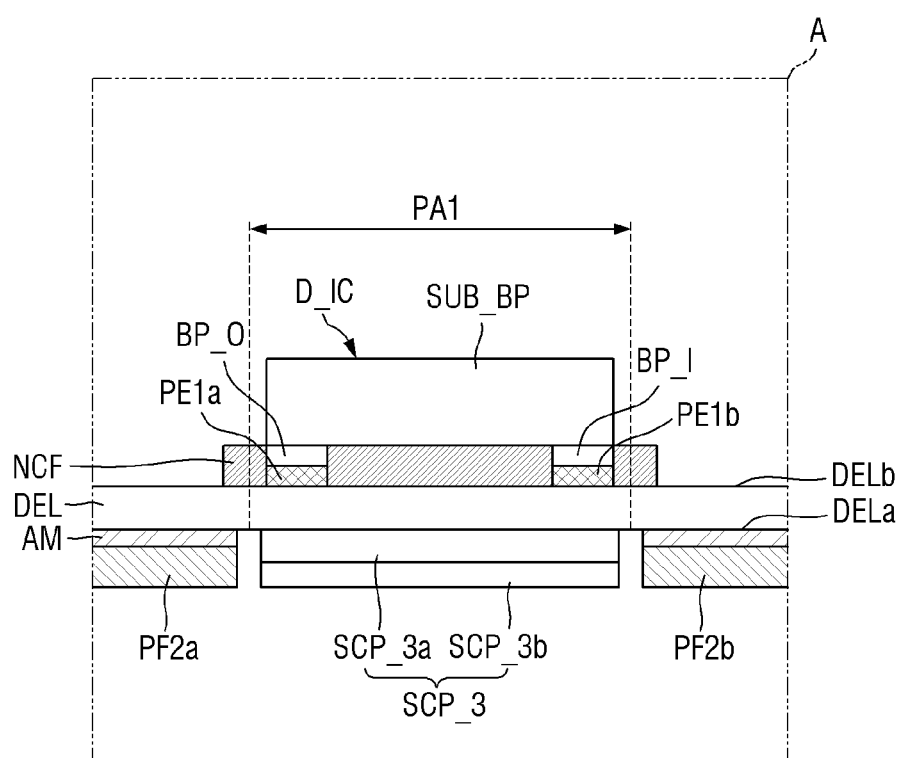
FIG. 16 is a cross-sectional view of a first pad area according to an embodiment.
Figure 17:
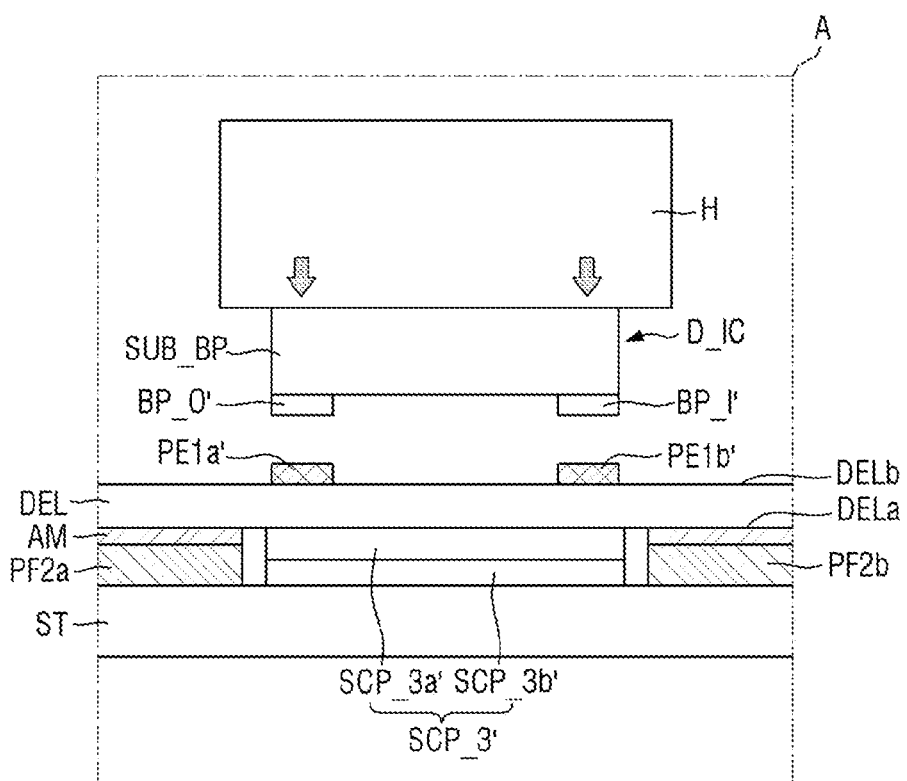
FIG. 17 is a cross-sectional view showing a processing step of ultrasonically bonding a driving chip to the first pad area shown in FIG. 16.
Figure 18:
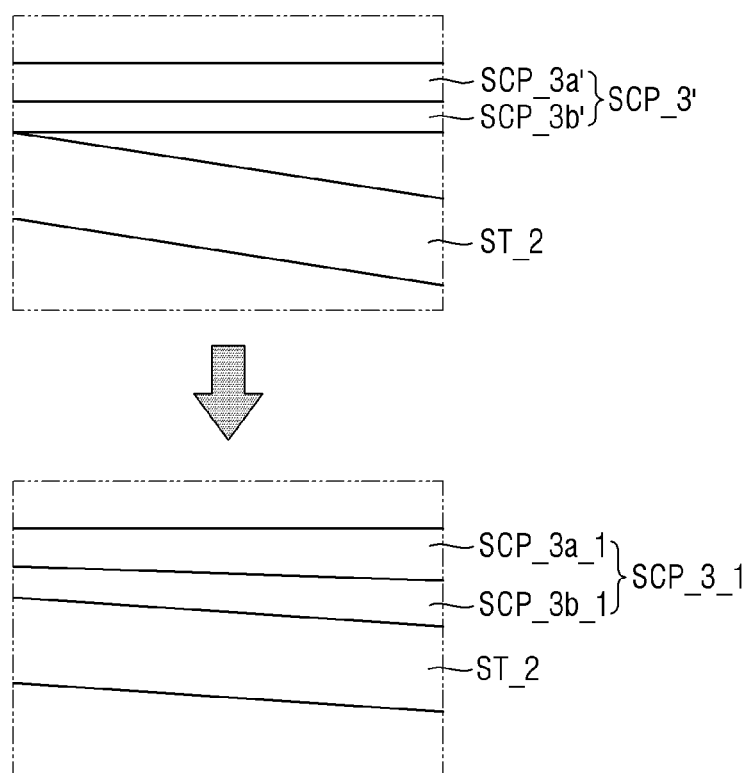
FIG. 18 is a cross-sectional view showing a processing step of ultrasonically bonding a driving chip to a first pad area according to an embodiment.
Figure 19:
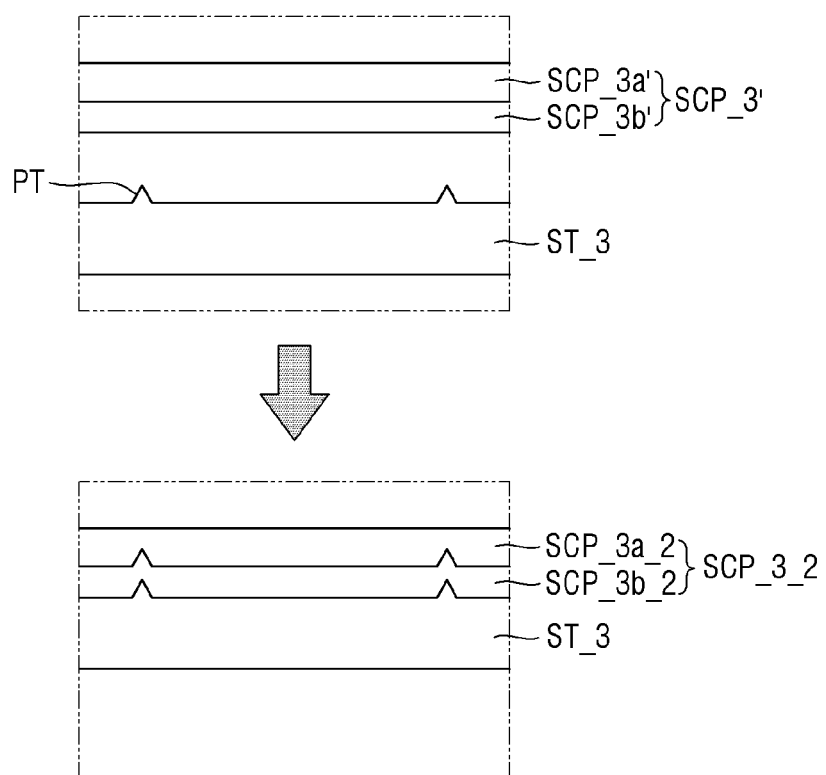
FIG. 19 is a cross-sectional view showing a processing step of ultrasonically bonding a driving chip to a first pad area according to an embodiment.

FIG. 16 is a cross-sectional view of a first pad area PA1 according to an embodiment. FIG. 17 is a cross-sectional view showing a process of ultrasonically bonding a driving chip to the first pad area PA1 shown in FIG. 16. FIG. 18 is a cross-sectional view showing a process of ultrasonically bonding a driving chip to a first pad area PA1 according to an embodiment. FIG. 19 is a cross-sectional view showing a process of ultrasonically bonding a driving chip to a first pad area PA1 according to an embodiment.

Referring to FIGS. 16 and 17, a step compensation member SCP_3 according to the current embodiment is different from the step compensation member SCP shown in FIG. 7 in that the step compensation member SCP_3 has a laminated structure of two or more materials.

More specifically, the step compensation member SCP_3 may include a first step compensation part SCP_3a (e.g., a first thickness portion) disposed on the other surface DELa of the display element layer DEL, and a second step compensation part SCP_3b (e.g., second thickness portion) disposed on the first step compensation part SCP_3a and further away from the display element layer DEL than the first step compensation part SCP_3a. That is, the first step compensation part SCP_3a may be disposed between the second step compensation part SCP_3b and the display element layer DEL.

For example, the first step compensation part SCP_3a may include a thermosetting resin, and the second step compensation part SCP_3b may include a metal. The hardness of the second step compensation part SCP_3b may be greater than a hardness of the first step compensation part SCP_3a. In an embodiment, the step compensation member SCP_3 includes in order from the display element layer DEL a first step compensation part SCP_3a including a resin, and a second step compensation part SCP_3b including a metal. The overall thickness of the step compensation member SCP_3 may be equal to the sum of the thickness of the adhesive member AM and the thickness of the second lower films PF2a and PF2b.

As shown in FIG. 17, in the process of applying heat pressure downward to the driving integrated circuit D_IC using the bonding device H, a first step compensation part SCP_3a' including a resin with fluidity before curing of a step compensation member SCP_3' may be cured by the heat to form the first step compensation part SCP_3a. The first step compensation part SCP_3a' including a resin with fluidity may be on a second step compensation part SCP_3b'.

FIG. 18 is an enlarged view of only the stage ST of FIG. 17 and the step compensation member SCP_3' before curing, and differs from FIG. 17 in that a stage ST_2 is bonded in a tilted position rather than in a flat position.

As shown in FIG. 18, in the process of applying heat pressure downward to the driving integrated circuit D_IC using the bonding device H, the first step compensation part SCP_3a' including a resin with fluidity (e.g., an uncured step compensation part) before curing of the step compensation member SCP_3' may be cured by the heat to provide the first step compensation member SCP_3a. That is, since the first step compensation part SCP_3a' includes the resin having fluidity before curing, when the stage ST_2 (non-flat stage ST_2) is tilted with respect to the extending direction of the display element layer DEL, as shown in FIG. 18, the first step compensation part SCP_3a' may be heat cured to form a first step compensation part SCP_3a_1 of a first step compensation member SCP_3_1, in a form of reflecting the inclination of the stage ST_2. That is, a surface of the first step compensation part SCP_3a_1 in contact with the second step compensation part SCP_3b_1 is tilted with respect to a surface of the first step compensation part SCP_3a_1 in contact with the display element layer DEL.

Referring to FIG. 18, the first step compensation part SCP_3a_1 includes a first surface in contact with the second step compensation part SCP_3b_1 and a second surface which opposite to the first surface and in contact with the pad area of the display panel 100, and the first surface is inclined with respect to the second surface.

That is, the first step compensation part SCP_3a' serves as a buffer when bumps BP_O' and BP_I' and first pad electrodes PE1a' and PE1b' are bonded in the process of disposing the driving integrated circuit D_IC. Thus, even when the stage ST_2 is not flat, the first step compensation part SCP_3a' may serve to correct the non-flatness of the stage ST_2, thereby improving the bonding quality.

FIG. 19 is an enlarged view of only the stage ST of FIG. 17 and the step compensation member SCP_3' before curing, and differs from FIG. 17 in that a stage ST_3 includes protruding patterns PT. As shown in FIG. 19, when the stage ST_3 includes the protruding patterns PT protruding toward a second step compensation part SCP_3' below a first step compensation part SCP_3b' of a step compensation member SCP_3', the first step compensation part SCP_3a' may be heat cured in a form of reflecting stepped portions (protruding patterns PT) of the stage ST_3, to form the first step compensation part SCP_3a' and the second step compensation part SCP_3b' as the first step compensation portion SCP_3a_2 and the second step compensation part SCP_3b_2 having the step portions. Referring to FIG. 19, the second step compensation part SCP_3b_2 includes a surface which is in contact with the first step compensation part SCP_3a_2 and has a stepped portion, and the first step compensation part SCP_3a_2 conforms to the stepped portion of the second step compensation part SCP_3b_2.

That is, the first step compensation part SCP_3a' serves as a buffer when bumps BP_O' and BP_I' and the first pad electrodes PE1a' and PE1b' are bonded in the process of disposing the driving integrated circuit D_IC, and thus even when the stage ST_3 is not flat, the first step compensation part SCP_3a' may serve to correct the non-flatness of the stage ST_3, thereby improving the bonding quality.

Figure 20:
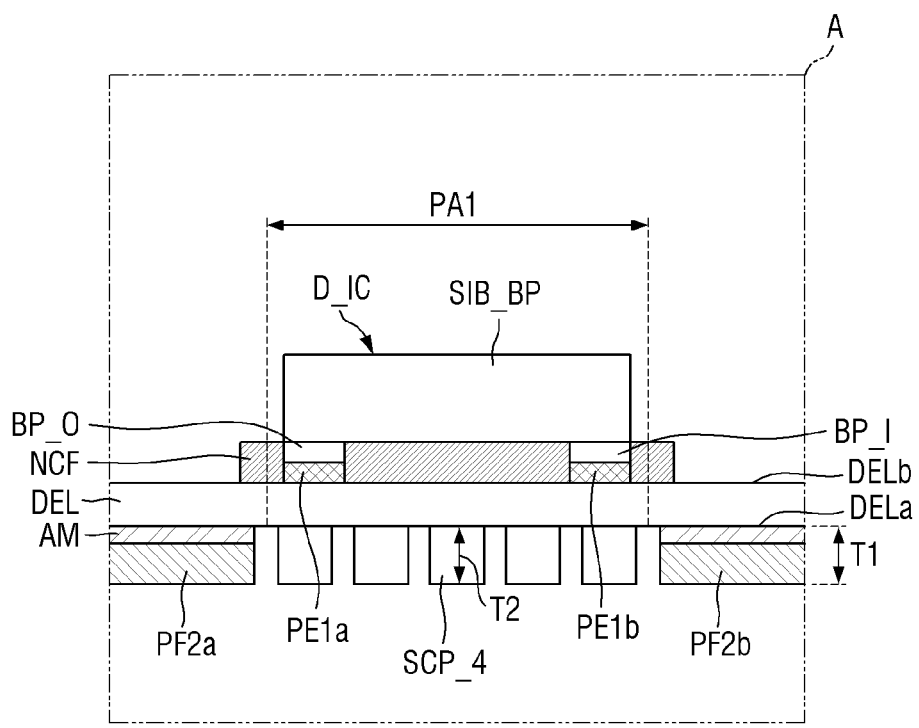
FIG. 20 is a cross-sectional view of a first pad area according to an embodiment.

FIG. 20 is a cross-sectional view of a first pad area PA1 according to an embodiment.

Referring to FIG. 20, a step compensation member SCP_4 according to the current embodiment is different from the step compensation member SCP shown in FIG. 7 in that the step compensation member SCP_4 includes a plurality of separated step compensation patterns.

More specifically, the step compensation member SCP_4 according to the current embodiment may include a plurality of separated step compensation patterns.

Other descriptions have been described above with reference to FIG. 7, and redundant descriptions will be omitted.

Figure 21:
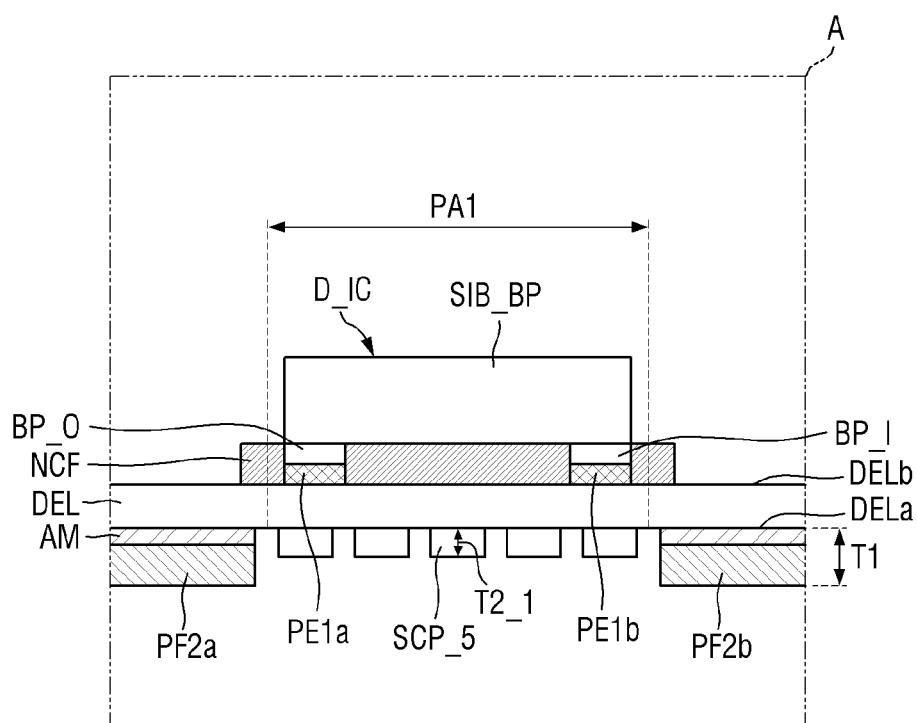
FIG. 21 is a cross-sectional view of a first pad area according to an embodiment.

FIG. 21 is a cross-sectional view of a first pad area PA1 according to an embodiment.

Referring to FIG. 21, a step compensation member SCP_5 according to the current embodiment is different from the step compensation member SCP_1 shown in FIG. 12 in that the step compensation member SCP_5 includes a plurality of separated step compensation patterns.

More specifically, the step compensation member SCP_5 according to the current embodiment may include a plurality of separated step compensation patterns.

Other descriptions have been described above with reference to FIG. 12, and redundant descriptions will be omitted.

According to embodiments of the present disclosure, it is possible to provide a display device with reduced cracks in a display panel 100 during ultrasonic bonding of pads of display panel to an external component, and a method of providing thereof.

However, the effects of the embodiments are not restricted to the one set forth herein. The above and other effects of the embodiments will become more apparent to one of daily skill in the art to which the embodiments pertain by referencing the claims.

What is claimed is:

1. A display device comprising:
   a display panel comprising a display area and a non-display area, the non-display area comprising a pad area; and
   a lower layer extending along the pad area of the display panel, the lower layer comprising:
      a first layer defining an opening at the pad area, the opening exposing a portion of the pad area to outside the first layer, and
      a component which is in the opening of the first layer and on the portion of the pad area which is exposed to outside the first layer.

2. The display device of claim 1, further comprising a driving chip facing the component with the pad area of the display panel therebetween.

3. The display device of claim 2, wherein the component comprises a resin.

4. The display device of claim 3, wherein the resin is a curable resin.

5. The display device of claim 4, wherein
   each of the component and the first layer has a surface which is furthest from the display panel, and
   the surface of the component is coplanar with the surface of the first layer.

6. The display device of claim 2, wherein the component comprises a metal.

7. The display device of claim 6, wherein
   each of the component and the first layer has a surface which is furthest from the display panel, and
   the surface of the component is closer to the display panel than the surface of the first layer.

8. The display device of claim 2, wherein the component comprises in order from the display panel:
   a base layer, and
   a second layer including a plurality of protrusion parts each protruding from the base layer and in a direction away from the driving chip.

9. The display device of claim 8, wherein
   the plurality of protrusion parts comprise ends which are furthest from the display panel and aligned with each other,
   the first layer has a surface which is furthest from the display panel, and
   the ends of the plurality of protrusion parts are coplanar with the surface of the first layer.

10. The display device of claim 2, wherein the component comprises in order from the display panel:
    a first part comprising a resin, and
    a second part comprising a metal.

11. The display device of claim 10, wherein
    the first part of the component includes a first surface in contact with the second part of the component and a second surface which opposite to the first surface and in contact with the display panel, and
    the first surface is inclined with respect to the second surface.

12. The display device of claim 10, wherein
    the second part of the component includes a surface which is in contact with the first part of the component and has a stepped portion, and
    the first part of the component conforms to the stepped portion of the second part of the component.

13. The display device of claim 2, wherein
    the display panel further comprises a pad electrode which is in the pad area,
    the driving chip comprises a bump electrically connected to the pad electrode of the display panel, and
    the pad electrode, the bump and the component overlap each other.

14. The display device of claim 13, wherein the pad electrode of the display panel and the bump of the driving chip are directly connected to each other.

15. The display device of claim 14, wherein the pad electrode and the bump are directly connected to each other by an ultrasonic bond.

16. The display device of claim 15, further comprising a non-conductive film between the driving chip and the display panel.

17. The display device of claim 1, wherein the first layer completely surrounds the pad area in a plan view.

18. The display device of claim 1, wherein the first layer completely surrounds the component in a plan view.

19. The display device of claim 1, wherein
    the non-display area further comprises a bending area, and
    the pad area is disposed adjacent to the bending area.

20. An electronic device comprising:
    a display device which displays an image; and
    the display device comprising:
       a display panel comprising a display area and a non-display area, the non-display area comprising a pad area; and
       a lower layer extending along the pad area of the display panel, the lower layer comprising:
          a first layer defining an opening at the pad area, the opening exposing a portion of the pad area to outside the first layer, and
          a component which is in the opening of the first layer and on the portion of the pad area which is exposed to outside the first layer.

* * * * *